(12) United States Patent (10) Patent No.: US 7,579,661 B2
Miyata et al. (45) Date of Patent: Aug. 25, 2009

(54) SEMICONDUCTOR DEVICE, ELECTRONIC DEVICE AND ELECTRONIC APPARATUS

(75) Inventors: Masayasu Miyata, Nagano (JP); Masamitsu Uehara, Nagano (JP)

(73) Assignee: Seiko Epson Corporation (JP)

( * ) Notice: Subject to any disclaimer, the term of this patent is extended or adjusted under 35 U.S.C. 154(b) by 303 days.

(21) Appl. No.: 10/579,871

(22) PCT Filed: Nov. 17, 2004

(86) PCT No.: PCT/JP2004/017439

§ 371 (c)(1),
(2), (4) Date: May 18, 2006

(87) PCT Pub. No.: WO2005/050743

PCT Pub. Date: Jun. 2, 2005

(65) Prior Publication Data

US 2007/0102823 A1 May 10, 2007

(30) Foreign Application Priority Data

Nov. 20, 2003 (JP) ............................. 2003-391459
Jul. 27, 2004 (JP) ............................. 2004-219191

(51) Int. Cl.
*H01L 29/92* (2006.01)
(52) U.S. Cl. ..................... 257/410; 257/368; 257/411
(58) Field of Classification Search ................ 257/368, 257/410, 411
See application file for complete search history.

(56) References Cited

U.S. PATENT DOCUMENTS 5,521,127 A 5/1996 Hori

| 6,191,463 | B1 | 2/2001 | Mitani et al. |
| 6,208,002 | B1 * | 3/2001 | Satake et al. ................. 257/410 |
| 6,444,533 | B1 | 9/2002 | Lyding et al. |
| 2002/0140043 | A1 | 10/2002 | Mitani et al. |
| 2003/0168707 | A1 | 9/2003 | Sakamoto et al. |

FOREIGN PATENT DOCUMENTS

| EP | 0 892 424 | 6/1998 |
| EP | 1 347 507 | 7/2002 |
| EP | 1 347 503 A2 | 9/2003 |
| JP | 09-162185 A | 6/1997 |

(Continued)

OTHER PUBLICATIONS

International Search Report for PCT/JP2004/017439, dated Feb. 18, 2005; ISA/JPO.

(Continued)

*Primary Examiner*—Edward Wojciechowicz
(74) *Attorney, Agent, or Firm*—Harness, Dickey & Pierce, P.L.C.

(57) ABSTRACT

An semiconductor device (1) of the invention includes a semiconductor substrate provided with a channel region (21), a source region (22) and a drain region (23), a gate insulating film (3) laminated on the channel region (21), and a gate electrode (5). The gate insulating film (3) is formed of an insulative inorganic material as a main material, and further contains hydrogen. The absorbance of infrared radiation of which wave number is in the range of 3200 to 3500 cm$^{-1}$ is 0.02 or less when the gate insulating film (3) to which an electric field has never been applied is measured with Fourier Transform Infrared Spectroscopy at room temperature.

9 Claims, 13 Drawing Sheets

FOREIGN PATENT DOCUMENTS

| | | |
|---|---|---|
| JP | 2000-260983 | 9/2000 |
| JP | 2002-299399 A | 10/2002 |
| JP | 2002-299612 A | 10/2002 |
| JP | 2003-264285 A | 9/2003 |

OTHER PUBLICATIONS

"Interface-trap generation at ultrathin SiO2 interfaces during negative-bias temperature aging"; Shigeo Ogawa, Masakazu Shimaya, and Noboru Shiono; J. Appl. Phys 77 (3), Feb. 1, 1995; 1995 American Institute of Physics, pp. 1137-1148.

"Improved hydrogen free chemical vapor depsoition of silicon dioxide"; Yasutaka Uchida, Kohshi Taguchi, and Masakiyo Matsumura; Journal of Non-Crystalline Solids 354 (1999) 11-16; 1999 Elsevier Science B. V.

"Effect of N2O/SiH4 ratio on the properties of low-temperature silicon oxide films from remote plasma chemical vapour deposition"; Youg-Bae Park, Jin-Kyu Kang, Shi-Woo Rhee; Thin Solid Films 280 (1996) 43-50; Elsevier Science S.A.

* cited by examiner

SEMICONDUCTOR DEVICE, ELECTRONIC DEVICE AND ELECTRONIC APPARATUS

TECHNICAL FIELD

The present invention relates to an insulating film, a semiconductor device, an electronic device and an electronic apparatus.

BACKGROUND ART

Recently, in devices including semiconductor integrated circuits, in order to improve high integration thereof, the size of each element tends to become miniaturization increasingly. In a Metal Oxide Semiconductor Field Effect Transistor (MOSFET), for example, the thickness of a gate insulating film (gate insulator) becomes less than 10 nm, and therefore it is difficult to ensure resistance to a dielectric breakdown of the insulating film.

The dielectric breakdown of a gate insulating film includes a Time Zero Dielectric Breakdown (TZDB) and a time-dependent dielectric breakdown (TDDB). The TZDB is an initial failure of the gate insulating film, and means a dielectric breakdown in which a large leakage current flows in the insulating film at the moment of applying an electric stress such as a voltage stress, a current stress or the like. On the other hand, the TDDB is a phenomenon in which a dielectric breakdown occurs in the gate insulating film when some time has passed since the application of an electric stress, not at the time point when the electric stress is applied to the gate insulating film.

Further, the TDDB is, classified into a hard breakdown (HBD) and a soft breakdown (SBD). The HBD is a well-known dielectric breakdown, and a large leakage current flows in an insulating film after breakdown. On the other hand, the SBD is a state at which a leakage current flows more than at an initial dielectric breakdown state, but less than at the time after the HBD occurs. The HBD is a dielectric breakdown that occurs when a relatively high electric stress is applied to an insulating film. Once a leakage current flows when the HBD occurs, an insulating property thereof is never recovered even though the insulating film is left without application of an electric stress thereto thereafter. On the other hand, the SBD is a dielectric breakdown that often occurs when a low electric stress is applied thereto. There is a case in which an insulating property thereof is recovered if the insulating film is left without application of an electric stress thereto after a leakage current occurred.

Therefore, a MOSFET in which a SBD occurs may function as a semiconductor device (semiconductor element) although an insulating property thereof becomes unstable. Further, there is a possibility that the SBD shifts to the HBD as time goes by.

In addition, there is a low electric field leakage current referred to as a stress-induced leakage current (SILC) as deterioration after application of the electric stress. The SILC attracts attention as a precursor of the TDDB in addition to influence on an insulating film that a leakage current is increased. In this regard, each of the SILC and SBD still has many unclear points even though various examinations have been carried out. The SBD is also referred to as "B-mode SILC", and thus the distinction between the SILC and the SBD is unclear.

In these deterioration modes of the insulating film, the SBD and SILC particularly become problems in thinning a gate insulating film. In the case where the thickness of the gate insulating film (gate oxidized film) is 10 nm or less, the deterioration frequently occurs in the low electric field intensity range of 10 MV/cm or less (that is, in the low voltage range in which the electric field intensity is in the range of 10 MV/cm or less), and this becomes major cause that prevent a gate insulating film from being thinned.

For example, Japanese Laid-Open Patent Application No. 2002-299612 discloses an insulating film (gate insulating film) of a semiconductor device in which density of hydrogen atoms is reduced to a predetermined value in order to prevent the occurrence of the SILC. However, the above-mentioned patent application focuses on prevention of occurrence of the SILC, and as a result, the occurrence of the SBD is not examined and discussed in this application. In this regard, each of hydrogen atoms in the insulating film exists at a state of molecular hydrogen or at a connected state to any one of constituent elements of the insulating film. However, this patent application only defines the total amount of hydrogen atoms. According to consideration of the present inventors, it is understood that it is difficult to prevent the occurrence of SBD only by reducing the total amount of hydrogen atoms in the insulating film.

DISCLOSURE OF INVENTION

It is therefore an object of the present invention to provide a semiconductor device including an insulating film that can prevent SBD or SILC from occurring even in the case of thinning the insulating film and have high resistance to a dielectric breakdown such as SILC, TZDB, or TDDB (that is, that can improve insulating properties to SILC, TZDB, or TDDB). It is another object of the present invention to provide a highly reliable electronic device and electronic apparatus that include the above-mentioned semiconductor device.

In order to achieve the above object, in one aspect of the present invention, the present invention is directed to a semiconductor device including an insulating film. The insulating film is formed of an insulative inorganic material as a main material, and the insulative inorganic material contains silicon and at least one kind of element other than silicon. The insulating film further contains hydrogen atoms. The absorbance of infrared radiation of which wave number is in the range of 3200 to 3500 cm$^{-1}$ is 0.02 or less when the insulating film to which an electric field has never been applied is measured with Fourier Transform Infrared Spectroscopy at room temperature.

This makes it possible to prevent SBD or SILC from occurring even in the case of thinning the insulating film and to have high resistance to a dielectric breakdown such as SILC, TZDB, or TDDB (that is, it is possible to improve insulating properties to SILC, TZDB, or TDDB).

In the semiconductor device of the present invention, it is preferable that the insulating film includes a plurality of particular structures of atomic groups each of which is constructed from hydrogen and the at least one kind of element other than silicon and in which a hydrogen atom is bonded to an atom of the at least one kind of element other than silicon, and that the absorption of the infrared radiation having the wave number within the range is derived from the plurality of particular structures of the atomic groups.

In the semiconductor device of the present invention, it is preferable that the at least one kind of element other than silicon includes oxygen.

This makes the semiconductor device of the present invention have high reliability.

In the semiconductor device of the present invention, it is preferable that the at least one kind of element other than silicon further includes at least one of nitrogen, hafnium, zirconium, and aluminum in addition to oxygen.

This makes it possible to improve compactness, stability and dielectric constant of the insulating film.

In the semiconductor device of the present invention, it is preferable that each hydrogen atom in at least a part of the hydrogen atoms is replaced by a deuterium atom.

This makes it possible to improve resistance to a dielectric breakdown of the insulating film.

In the semiconductor device of the present invention, it is preferable that the average thickness of the insulating film is 10 nm or less.

According to the present invention, it is possible to remarkably improve resistance to a dielectric breakdown of the insulating film having a film thickness in the range described above.

In the semiconductor device of the present invention, it is preferable that the semiconductor device includes a gate electrode and a gate insulating film for insulating the gate electrode, and the gate insulating film is formed from the insulating film.

This makes it possible to prevent a dielectric breakdown of the gate insulating film, and therefore it is possible to improve the characteristics of the semiconductor device of the present invention.

In the semiconductor device of the present invention, it is preferable that the semiconductor device is adapted to be used under the condition that a gate voltage is applied to the gate electrode so that the electric field intensity in the insulating film is 10 MV/cm or less.

According to the present invention, it is possible to remarkably improve resistance to a dielectric breakdown of the insulating film in the semiconductor device to be used under such an applied voltage.

In the semiconductor device of the present invention, it is preferable that a leakage current passing through the gate insulating film in the thickness direction thereof that is measured in a state that the gate voltage is applied to the gate electrode so that the electric field intensity in the insulating film is 5 MV/cm or less is $9 \times 10^{-9}$ A/cm$^2$ or less.

This makes it possible to further prevent a dielectric breakdown of the gate insulating film when the semiconductor device of the present invention is used.

In the semiconductor device of the present invention, it is preferable that the total amount of electrical charges passing through the gate insulating film in the thickness direction thereof until a soft breakdown occurs in the insulating film is 40 C/cm$^2$ or more.

This makes it possible to further prevent a dielectric breakdown of the gate insulating film when the semiconductor device of the present invention is used.

In the semiconductor device of the present invention, it is preferable that the total amount of electrical charges passing through the gate insulating film in the thickness direction thereof until a hard breakdown occurs in the insulating film is 100 C/cm$^2$ or more.

This makes it possible to further prevent a dielectric breakdown of the gate insulating film when the semiconductor device of the present invention is used.

In the semiconductor device of the present invention, it is preferable that the Fourier Transform Infrared Spectroscopy is Multi-Reflection Attenuated Total Reflection Method.

This makes it possible to measure the absorbance of infrared radiation with high sensitivity.

Further, in another aspect of the present invention, the present invention is directed to an electronic device. The electronic device of the present invention includes the semiconductor device described above.

This makes it possible to obtain an electronic device having high reliability.

Moreover, in yet another aspect of the present invention, the present invention is directed to an electronic apparatus. The electronic apparatus of the present invention includes the electronic device described above.

This makes it possible to obtain an electronic apparatus having high reliability.

BRIEF DESCRIPTION OF DRAWINGS

The above and other objects, features, and the advantages of the invention will readily become more apparent from the following detailed description of preferred embodiments of the invention with reference to the accompanying drawings.

BEST MODE FOR CARRYING OUT THE INVENTION

Hereinafter, a semiconductor device, an electronic device and an electronic apparatus of the present invention will now be described with respect to preferred embodiments thereof. In this regard, a semiconductor device of the present invention has a feature in an insulating film that is applied to a gate insulating film of the semiconductor device.

<Semiconductor Device>

First, a semiconductor device of the present invention will now be described.

Figure 1:
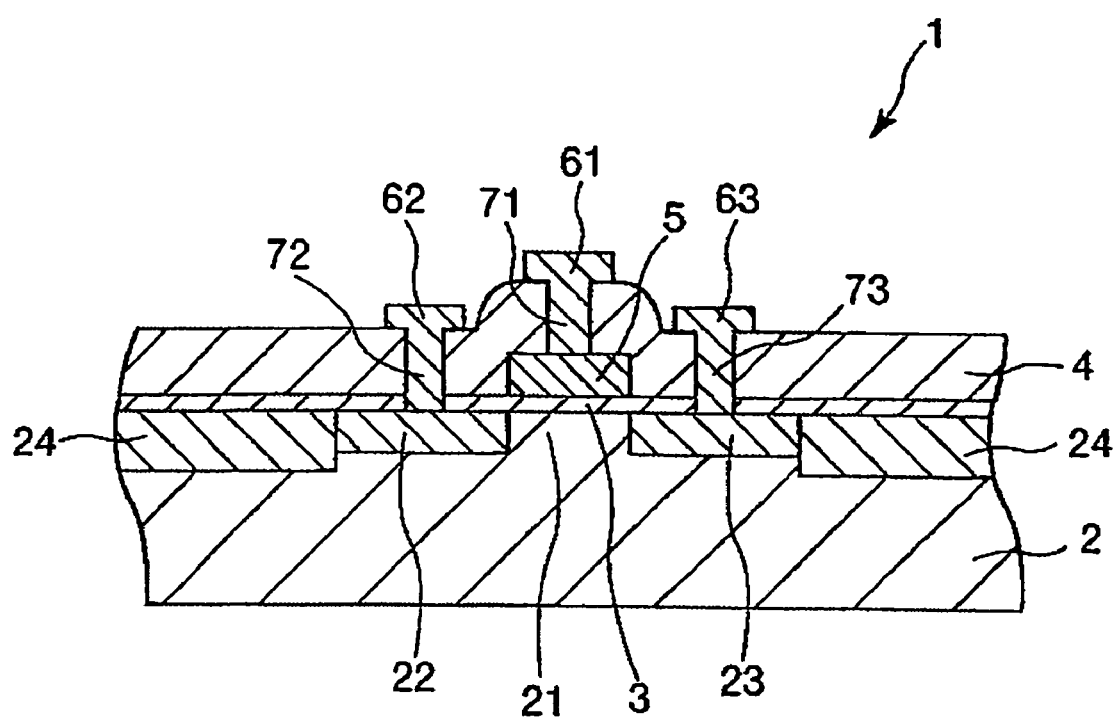
FIG. 1 is a longitudinal cross sectional view which shows a semiconductor device including an insulating film in one embodiment according to the present invention.
Figure 2:
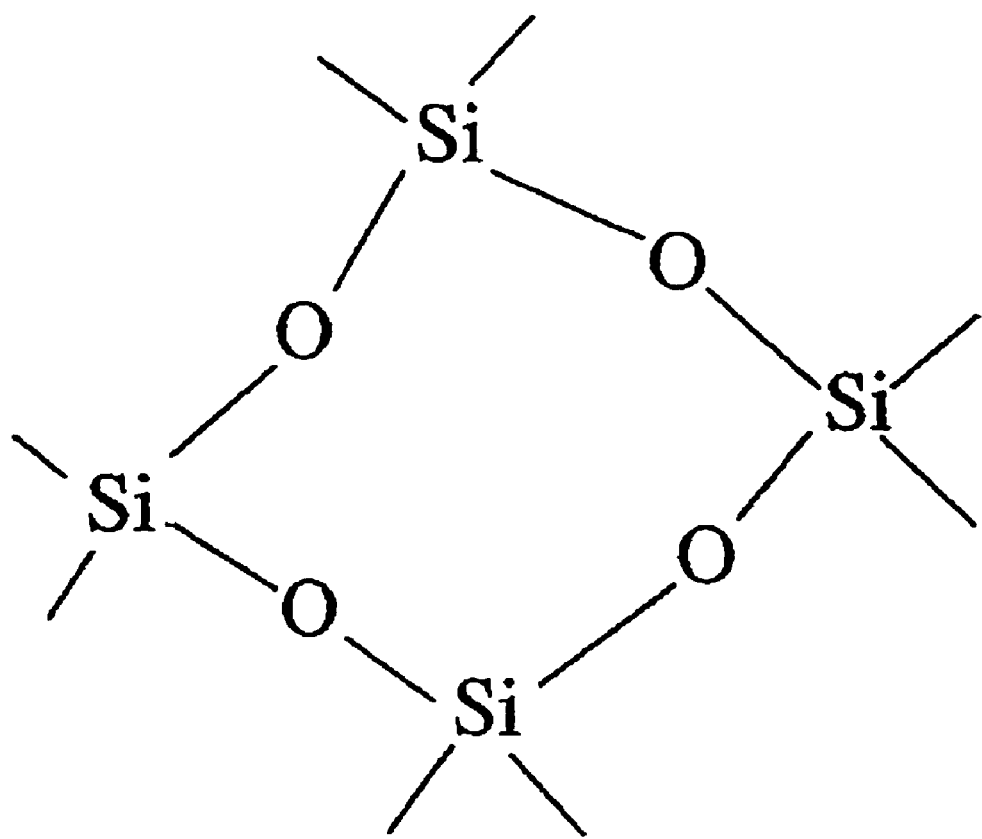
FIG. 2 is a schematic view which shows a molecular structure of the insulating film.
Figure 3:
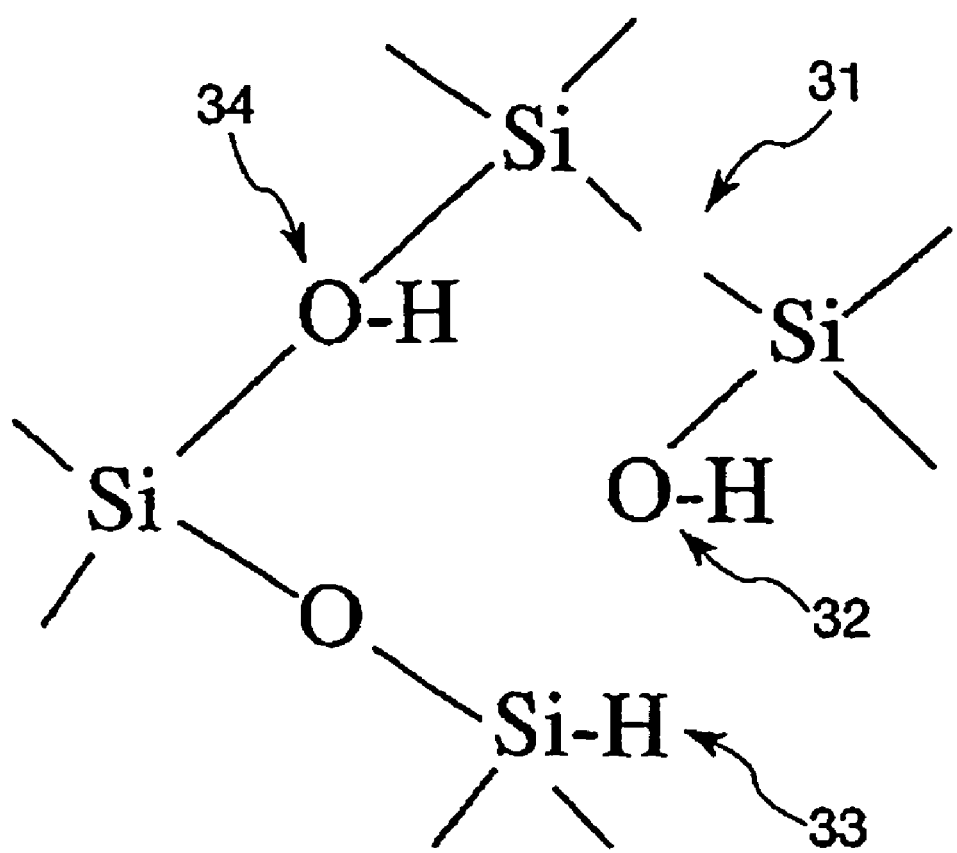
FIG. 3 is a schematic view which shows a molecular structure of the insulating film.

FIG. 1 is a longitudinal cross sectional view which shows a semiconductor device including an insulating film in one embodiment according to the present invention. FIGS. 2 and 3 are schematic views each of which shows a molecular structure of the insulating film. Now, in following explanations using FIG. 1, for convenience of explanation, an upper side and lower side in FIG. 1 are referred to as "upper" and "lower," respectively.

A semiconductor device 1 shown in FIG. 1 includes a semiconductor substrate 2, a gate insulating film provided so as to cover the semiconductor substrate 2, and an interlayer insulating film 4. The semiconductor substrate 2 includes an element separate structure 24, a channel region 21, a source region 22, and a drain region 23. The semiconductor device 1 further includes a gate electrode 5 provided so as to face the channel region 21 via the gate insulating film 3, a conductive portion 61 provided on the interlayer insulating film 4 and above the gate electrode 5, a conductive portion 62 provided on the interlayer insulating film 4 and above the source region 22 and functioning as a source electrode, a conductive portion 63 provided on the interlayer insulating film 4 and above the drain region 23 and functioning as a drain electrode, a contact plug 71 which electrically connects the gate electrode 5 to the conductive portion 61, a contact plug 72 which electrically connects the source region 22 to the conductive portion 62, and a contact plug 73 which electrically connects the drain region 23 to the conductive portion 63.

The semiconductor substrate 2 is formed of a semiconducting material including, for example, silicon such as polycrystalline silicon, amorphous silicon, or the like, germanium, gallium arsenide. As described above, the semiconductor substrate 2 has the element separate structure 24, and the channel region 21, the source region 22, and the drain region 23 are provided in regions compartmented by the element separate structure 24. Further, in the semiconductor substrate 2, the source region 22 is formed at one side portion of the channel region 21, while the drain region 23 is formed at the other side portion of the channel region 21. The element separate structure 24 is constructed so that an insulating material such as $SiO_2$ is embedded in a trench. This makes it possible to separate adjacent elements electrically, and therefore it is possible to prevent interference between adjacent elements.

The channel region is formed of an intrinsic semiconductor, for example. Each of the source region 22 and the drain region 23 are formed of a semiconductor material in which an intrinsic semiconductor is doped with an n-type impurity such as $P^+$ (phosphorus ion), for example. It should be noted that each of the channel region 21, the source region 22 and the drain region 23 is not limited thereto. For example, each of the source region 22 and the drain region 23 may be constituted so as to be formed of a semiconducting material in which an intrinsic semiconductor is doped with a p-type impurity. Further, the channel region 21 may be constituted so as to be formed of a semiconducting material in which an intrinsic semiconductor is doped with a p-type or n-type impurity.

Such a semiconductor substrate 2 is covered with an insulating film (that is, the gate insulating film 3 and the interlayer insulating film 4). The portion of the insulating film (the gate insulating film 3) that is sandwiched between the channel region 21 and the gate electrode 5 serves as a channel of an electric field generated between the channel region 21 and the gate electrode 5.

The semiconductor device of this embodiment has a feature in the structure of this gate insulating film 3. This point (feature) will be described later in detail.

The constituent material of the interlayer insulating film 4 is not particularly limited, and for example, silicon system compound such as $SiO_2$, TEOS (ethyl silicate), poly-silazane can be used as the constituent material of the interlayer insulating film 4. In addition, the interlayer insulating film 4 can be formed of any one of various resin materials, various ceramics materials and the like, for example.

The conductive potions 61, 62 and 63 are provided on the interlayer insulating film 4. As described above, the conductive portion 61 is formed above the channel region 21, and the conductive portions 62, 63 are formed above the source region 22 and the drain region 23, respectively. Further, in the gate insulating film 3 and the interlayer insulating film 4, a hole portion (contact hole) communicated to the gate electrode 5, a hole portion communicated to the source region 21, and a hole portion communicated to the drain region 23 are formed in the region where the channel region 21, the source region 22, and the drain region 23 are formed, respectively. The contact plugs 71, 72 and 73 are provided in these hole portions, respectively.

The conductive portion 61 is connected to the gate electrode 5 via the contact plug 71. The conductive portion 62 is connected to the source region 22 via the contact plug 72. The conductive portion 63 is connected to the drain region 23 via the contact plug 73.

Next, a structure of the gate insulating film 3 will now be described. In the present invention, the gate insulating film 3 is formed of an insulative inorganic material containing silicon and at least one kind of element other than silicon as a main material. The gate insulating film 3 further contains hydrogen atoms.

The absorbance of infrared radiation of which wave number is in the range of 3200 to 3500 $cm^{-1}$ is 0.02 or less when the gate insulating film 3 to which an electric field has never been applied is measured with Fourier Transform Infrared Spectroscopy at room temperature. In this regard, the absorbance is a value represented as $\log(I_0/I)$ when incident light intensity and transmitted light intensity are defined as $I_0$ and $I$.

The absorbance of the infrared radiation changes in proportion to the amount of particular structures of atomic groups that reside in the gate insulating film 3. The absorbance of the infrared radiation when wave number thereof is in the range of 3200 to 3500 $cm^{-1}$ is derived from the particular structures of the atomic groups in which a hydrogen atom is bonded to an atom of the element other than silicon in constituent elements of the insulative inorganic material. Therefore, the state that the absorbance of infrared radiation of which wave number is in the range of 3200 to 3500 $cm^{-1}$ is 0.02 or less means that the particular structures described above are few and far between in the gate insulating film 3 to which an electric field has never been applied at room temperature.

The inventors of the present invention have persevered in keen examination in order to prevent SBD from occurring in the gate insulating film 3. As a result, the present inventors found that the occurrence of the SBD could not be prevented only by specifying the total amount of hydrogen atoms in the gate insulating film 3 as the conventional manner. The inventors of the present invention further persevered in examination, and then found that the occurrence of the SBD in the gate insulating film 3 is suitably prevented or restrained so that the semiconductor device 1 can have high resistance to a dielectric breakdown by specifying the amount of hydrogen atoms that exist at a particular state, that is, by specifying the amount of existing particular structures described above. The present inventors led to the completion of the present invention.

Hereinafter, with respect to this point, the case where the gate insulating film 3 is constructed from a $SiO_2$ film that is made from silicon oxide ($SiO_z$, $0<Z\leq2$: that is, SiO and $SiO_2$) as a main material will be specifically described as one example. Namely, as shown in FIG. 2, the $SiO_2$ film is constructed from substantially complete three-dimension network of Si—O bonding formed by coordinating one silicon atom with four oxygen atoms as well as by coordinating one oxygen atom with two silicon atoms. The $SiO_2$ film is in an amorphous state at which the directionality of bonding becomes disorganized.

When the $SiO_2$ film is formed by means of a thermal oxidation method, a CVD (Chemical Vapor Deposition) method or the like as described later, hydrogen atoms inevitably come to be mixed in the inside of the $SiO_2$ film due to gases existing in the atmosphere which includes molecular hydrogen and hydrogen atom. As shown in FIG. 3, hydrogen atoms exist in the inside of the $SiO_2$ film as a Si—OH structure 32 or a Si—H structure 33 as well as molecular hydrogen ($H_2$). The Si—OH structure 32 and the Si—H structure 33 are formed by reacting with Si—O bonding or an incomplete coordinate structure 31, and as a result, they have an impact on an electronic structure (electronic state) of the constituent material of the gate insulating film 3.

The inventors of the present invention further persevered in examination and found that a Si—OH structure 34 in which one oxygen atom is coordinated with three other atoms with first principle electronic structure simulation. In addition, the present inventors found that an excess electron, in the Si—OH structure 34 contributes to a current, that is, that the more the Si—OH structures 34 exist in the gate insulating film 3, the more a leakage current flows over the gate insulating film 3 (the more easily the TZDB occurs). On the other hand, the present inventors confirmed that the Si—OH structure 32 or the Si—H structure 33 does not contribute a current because these structures stably exist in the gate insulating film 3.

Further, the present inventors found that the Si—OH structures 34 are susceptible to an outer electric field and stabilized by an electric field to be increased, and as a result a leakage current due to electric stress (that is, SILC) may be increased, by which a generation mechanism of the SBD can be explained. Then, the present inventors found that the HBD tends to occur as these results.

In this regard, the absorbance of the infrared radiation when wave number thereof is in the range of 3200 to 3500 $cm^{-1}$ as described above is derived from the Si—OH structure 34 in the $SiO_2$ film (the $SiO_2$ film). Therefore, it can be obviously distinguished from the absorbance of the infrared radiation derived from the other structures in which hydrogen atom is bonded to oxygen atom or silicon atom (that is, the structures 32, 33).

Therefore, by using the absorbance of the infrared radiation when wave number thereof is in the range of 3200 to 3500 $cm^{-1}$ as an indicator, it is possible to selectively confirm the amount of Si—OH structures 34 that cause a dielectric breakdown.

Moreover, as mentioned above, the present inventors found that the amount of Si—OH structures 34 is increased in response to intensity and time of an electric stress. Thus, the present inventors found that the less the amount of Si—OH structures 34 is in the gate insulating film 3 to which electric stress has never been applied, the superior resistance to a dielectric breakdown the gate insulating film 3 has.

For this reason, in the $SiO_2$ film in which the absorbance of the infrared radiation of which wave number is in the above-mentioned range is 0.02 or less at room temperature an extremely few Si—OH structures 34 exist, and such a $SiO_2$ film has superior resistance to a dielectric breakdown because it is difficult for the SILC, TZDB, SBD, or HBD to occur in the $SiO_2$ film. Namely, almost gate insulating films 3 can pass general dielectric breakdown test (that is, TZDB or TDDB test) when testing the gate insulating films 3 having the absorbance in this range.

Further, a semiconductor device 1 in which such a $SiO_2$ film is applied to a gate insulating film thereof can obtain stable characteristics and durability performance. In this regard, in order to evaluate resistance to a dielectric breakdown of an insulating film, a large numbers of tests must be repeated to obtain statistical data and it takes long time and the cost for carrying out the tests is increased. Further, of course, the insulating film after test cannot be utilized as a product because insulation of the insulating film is destroyed.

Correspondingly, a method of using the absorbance of infrared radiation as the present invention is a versatile method (evaluation method) because this method is easy to be carried out and does not require much time and many costs, and can determine dielectric breakdown characteristics of the insulating film without influence on the insulating film (in non-destructive method). Furthermore, when specifying the absorbance of infrared radiation corresponding to the Si—OH structures 34 (in the present invention, it is 0.02 or less), an insulating film ($SiO_2$ film) is one to which an electric stress has never been applied, and specifying the absorbance of infrared radiation when measured at room temperature (ordinary temperature) under the condition that stress is not applied to the insulating film during the measurement makes clear the correspondence to experimental results (the absorbance of infrared radiation measured in the insulating film), and is most appropriate.

In this regard, as described above, the absorbance of infrared radiation of which wave number is in the range of 3200 to 3500 $cm^{-1}$ is 0.02 or less. However, it is preferable that the absorbance is 0.018, and more preferably it is 0.015. This makes it possible to prevent a dielectric breakdown of the gate insulating film 3 more surely. Further, in general, the dielectric breakdown of the gate insulating film 3 tends to occur due to frequent usage (frequent application of voltage to the gate electrode 5). However, by restricting the absorbance of the infrared radiation within the range described above, the amount of Si—OH structures 34 is controlled within an appropriate range even though the semiconductor device 1 has been used frequently. This makes it possible to prevent a dielectric breakdown of the gate insulating film 3 more surely.

The constituent material (insulative inorganic material) of the gate insulating film 3 as described above is not limited to one formed from silicon oxide as a main material, and the gate insulating film 3 may contain other element (atoms of other element) other than silicon and oxygen. It is preferable that the other element includes at least one of nitrogen, hafnium, zirconium, and aluminum. By containing nitrogen atoms, it is possible to improve compactness of the gate insulating film 3, for example. Further, by containing nitrogen, hafnium, zirconium, or aluminum, it is possible to improve the stability of the gate insulating film 3 and dielectric constant of the gate insulating film 3, for example.

A method of forming the gate insulating film 3 described above will be described later as well as a method of manufacturing the semiconductor device 1.

Each hydrogen atom in at least a part of the hydrogen atoms in the gate insulating film 3 may be replaced by deuterium atom. This makes it possible to further reduce instable structures to an outer electric field (the structures in which a hydrogen atom is bonded to the element other than silicon in the constituent elements of the insulative inorganic material). As a result, it is possible to improve resistance to a dielectric breakdown of the gate insulating film 3.

It is preferable that the average thickness of the gate insulating film 3 (the average film thickness) is 10 nm or less, and more preferably it is in the range of about 1 to 7 nm. By restricting the thickness of the gate insulating film 3 within the above range, it is possible to make the semiconductor device 1 smaller sufficiently. Further, the SBD tends to occur frequently in particular when the thickness of the gate insulating film 3 is made thinner as the range described above. Thus, by applying the present invention to the gate insulating film 3 having such a thinner film thickness, it is possible to exert an effect of the present invention prominently.

It is preferable that Multi-Reflection Attenuated Total Reflection (ATR) Method is in particular utilized in the Fourier Transform Infrared Spectroscopy to measure the absorbance of infrared radiation. The Multi-Reflection Attenuated Total Reflection Method is a method of detecting the reflected light after infrared radiation is repeatedly total-reflected onto a surface of the sample to be measured, and has some advantages including (1) the yield of light is high because the infrared radiation is total-reflected, (2) it is possible to obtain high sensitivity of the reflected light because a signal (a signal of the reflected light) is amplified by multi-reflection.

Further, it is preferable that the semiconductor device 1 is adapted to be used under the condition that a gate voltage is applied to the gate electrode 5 so that the electric field intensity in the gate insulating film 3 is 10 MV/cm or less. More preferably the electric field intensity in the gate insulating film 3 is 5 MV/cm or less. In this regard, there is a fear that an irreversible dielectric breakdown (that is, HBD) occurs when a higher gate voltage over the upper limit described above is applied to the gate electrode 5.

Moreover, it is preferable that a leakage current passing through the gate insulating film 3 in the thickness direction thereof that is measured in a state that the gate voltage is applied to the gate electrode 5 so that the electric field intensity in the insulating film is 5 MV/cm or less is $9 \times 10^{-9}$ A/cm$^2$ or less. More preferably the leakage current is $5 \times 10^{-9}$ A/cm$^2$ or less. By satisfying such a condition in the gate insulating film 3, it is difficult for a dielectric breakdown of the gate insulating film 3 to occur when the semiconductor device 1 is used.

Furthermore, in the case where the time point at which a small voltage change is initially generated is the SBD (soft breakdown) by supplying a constant current to the gate insulating film 3, it is preferable that the total amount of electric charges passing through the gate insulating film 3 in the thickness direction thereof until a soft breakdown (SBD) occurs in the gate insulating film 3 is 40 C/cm$^2$ or more. More preferably the total amount of the electric charges is 75 C/cm$^2$ or more. By satisfying such a condition in the gate insulating film 3, it is difficult for a dielectric breakdown of the gate insulating film 3 to occur when the semiconductor device 1 is used.

Further, in the case where the time point at which a drastic voltage change is generated is the HBD (hard breakdown), it is preferable that the total amount of electric charges passing through the gate insulating film 3 in the thickness direction thereof until a hard breakdown (HBD) occurs in gate the insulating film 3 is 100 C/cm$^2$ or more. More preferably the total amount of electric charges is 200 C/cm$^2$ or more. By satisfying such a condition in the gate insulating film 3, it is difficult for a dielectric breakdown of the gate insulating film 3 to occur when the semiconductor device 1 is used.

The structure of the semiconductor device 1 of the present invention including the gate insulating film 3 has been described on the basis of preferred embodiment shown in FIGS. 1-3, but such an insulating film having a feature described above can be applied to the interlayer insulating film 4 in the semiconductor device 1 of the present invention.

<Method of Manufacturing Semiconductor Device>

Next, a method of manufacturing the semiconductor device shown in FIG. 1 will now be described. FIGS. 4A-4H are longitudinal cross sectional views for explaining a method of manufacturing the semiconductor device shown in FIG. 1. Now, in following explanations using FIGS. 4A-4H, for convenience of explanation, an upper side and lower side in FIGS. 4A-4H are referred to as "upper" and "lower," respectively.

Figure 4A:
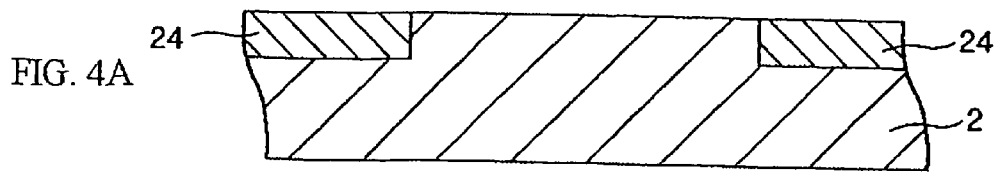
FIGS. 4A-4H are longitudinal cross sectional views for explaining a method of manufacturing the semiconductor device shown in FIG. 1.

<1> As shown in FIG. 4A, a trench element separate structure 24 is formed on the surface of a semiconductor substrate 2 by means of Local Oxidation of Silicon (LOCOS) method or the like. Thus, element forming regions are compartmented on the surface of the semiconductor substrate 2.

<2> Next, a well is formed by carrying out ion doping onto the semiconductor substrate 2. For example, in the case of forming a p-well, p-type impurities such as B$^+$ ions or the like are doped into the semiconductor substrate 2, while in the case of forming an n-well, n-type impurities such as p$^+$ ions or the like are doped into the semiconductor substrate 2.

Figure 4B:
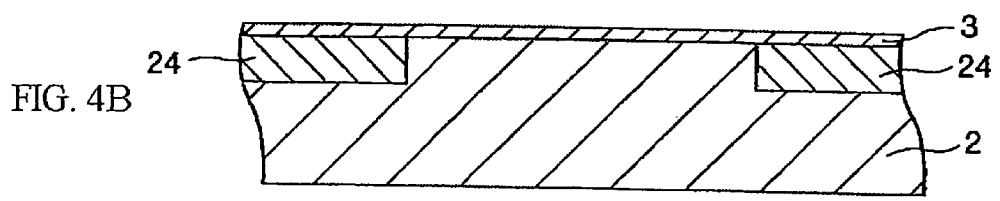

<3> Next, as shown in FIG. 4B, a gate insulating film 3 is formed on the semiconductor substrate 2.

I: Silicon Oxide Film

In the case where a silicon oxide (SiO$_2$) film is formed as a gate insulating film 3, a thermal oxidation method, a CVD (Chemical Vapor Deposition) method or the like can be utilized, for example.

I-1: Thermal Oxidation Method

The thermal oxidation method is a method of forming a silicon oxide film on the surface of the silicon substrate (the semiconductor substrate 2) by supplying a gas containing oxygen atoms onto the silicon substrate heated. It is preferable that the heating temperature is in the range of about 300 to 1,000° C., and more preferably it is in the range of about 500 to 800° C.

Since the heating time may be appropriately set according to the desired thickness of the silicon oxide film, the heating time is not particularly limited. For example, in the case where the heating temperature is set to be in the above range, it is preferable that the heating time is in the range of about 10 to 90 minutes, and more preferably it is in the range of about 20 to 60 minutes. Further, as the gas containing oxygen atoms, for example, molecule oxygen (pure oxygen), ozone, hydrogen peroxide, water vapor, nitrogen monoxide, nitrogen dioxide, dinitrogen oxide, or the like may be mentioned. One kind of these or combination of two or more kinds of these can be utilized as the gas containing oxygen atoms.

I-2: CVD Method

The CVD method is a method of forming a silicon oxide film on the surface of the silicon substrate (the semiconductor substrate 2) by introducing a gas containing precursors to silicon oxide and oxygen atoms in a chamber to which a constant pressure is applied and heating the silicon substrate (the semiconductor substrate 2). As the precursors to silicon oxide, dichlorosilane, hexachloro disilanete, trakis (hydrocarbyl-amino) silane, tris (hydrocarbyl-amino) silane, and the like may be mentioned. One kind of these or combination of two or more kinds of these can be utilized as the precursors to silicon oxide.

As the gas containing oxygen atoms, for example, molecule oxygen (pure oxygen), ozone, hydrogen peroxide, water vapor, nitrogen monoxide, nitrogen dioxide, dinitrogen oxide, or the like may be mentioned. One kind of these or combination of two or more kinds of these can be utilized as the gas containing oxygen atoms. Further, it is preferable that the heating temperature is in the range of about 300 to 1,000° C., and more preferably it is in the range of about 500 to 800° C.

Since the heating time may be appropriately set according to the desired thickness of the silicon oxide film, the heating time is not particularly limited. For example, in the case where the heating temperature is set to be in the above range, it is preferable that the heating time is in the range of about 10 to 90 minutes, and more preferably it is in the range of about 20 to 60 minutes. Moreover, it is preferable that the pressure (degree of vacuum) in the chamber is in the range of about 0.05 (6.67 Pa) to 760 Torr (that is, atmosphere pressure, $1.013 \times 10^5$ Pa), and more preferably it is in the range of about 0.1 (13.3 Pa) to 500 Torr ($6.67 \times 10^5$ Pa). Furthermore, it is preferable that a mixture ratio (mole ratio) of precursors to silicon oxide to a gas containing oxygen atoms is in the range of about 10:1 to 1:100, and more preferably it is in the range of about 1:2 to 1:10.

II: Silicon Oxynitride Film

In the case where a silicon oxynitride (SiON) film is formed as a gate insulating film 3, for example, the silicon oxynitride (SiON) film can be formed using a mixture gas of a gas containing oxygen atoms and a gas containing nitrogen atoms in place of a gas containing oxygen atoms in the CVD (Chemical Vapor Deposition) method described in I-2. As the gas containing nitrogen atoms, for example, ammonia, hydrazine, alkyl hydrazine compound, hydrogen azide, nitrogen monoxide, nitrogen dioxide, dinitrogen oxide, or the like may be mentioned. One kind of these or combination of two or more kinds of these can be utilized as the gas containing nitrogen atoms. In addition, the silicon oxynitride (SiON) film can be obtained by applying heat treatment to a silicon oxide film in the atmosphere including nitrogen gases ($N_2$), for example.

III: Hafnium Silicate Film, Zirconium Silicate Film, and Aluminum Silicate Film

In the case where a hafnium silicate (HfSiO) film, a zirconium silicate (ZrSiO) film, or an aluminum silicate (AlSiO) film is formed as a gate insulating film 3, a CVD (Chemical Vapor Deposition) method, a PVD method (Physical Vapor Deposition such as a vacuum evaporation method), a spattering method or the like can be utilized, for example.

Further, by mixing two or more compounds each constituting the insulating film as the gate insulating film 3 (that is, the silicon oxide film, silicon oxynitride film, hafnium silicate film, zirconium silicate film, and aluminum silicate film) and carrying out one method (herein, spattering method) or two or more methods described above, it is possible to form the gate insulating film 3 constituted from multiple compounds. Moreover, for example, heat treatment or the like may be applied to the obtained gate insulating film 3 in the atmosphere including water vapor ($H_2O$). In this case, it is preferable that the heating temperature is in the range of about 500 to 1,200° C., and more preferably it is in the range of about 700 to 1,000° C.

In the case where the heating temperature is set to be in the above range, it is preferable that the heating time is in the range of about 10 to 90 minutes, and more preferably it is in the range of about 20 to 60 minutes. Further, it is preferable that the relative humidity of the atmosphere is in the range of about 50 to 100% RH, and more preferably it is in the range of about 75 to 100% RH. By forming the gate insulating film 3 with the method and conditions described above, it is possible to prevent interfusion of hydrogen atoms, and this makes it possible to obtain the gate insulating film 3, in which the absorbance of infrared radiation of which wave number is in the range of 3200 to 3500 $cm^{-1}$ is 0.02 or less, more easily and surely.

In this regard, as a method of replacing each of hydrogen atoms in the gate insulating film 3 with a deuterium atom, for example, (A) a method of applying heat treatment to the gate insulating film 3 in the atmosphere including deuterium gas ($D_2$) after forming the gate insulating film 3; (B) a method of applying thermal oxidation to the semiconductor substrate 2 in the atmosphere including heavy water vapor ($D_2O$) when forming the gate insulating film 3; (C) a method of applying heat treatment to the gate insulating film 3 in the atmosphere including deuterated ammonia ($ND_3$) after forming the gate insulating film 3; or the like may be mentioned. One kind of these methods or combination of two or more kinds of these methods can be utilized as the method of replacing each of hydrogen atoms in the gate insulating film 3 with a deuterium atom.

Figure 4C:
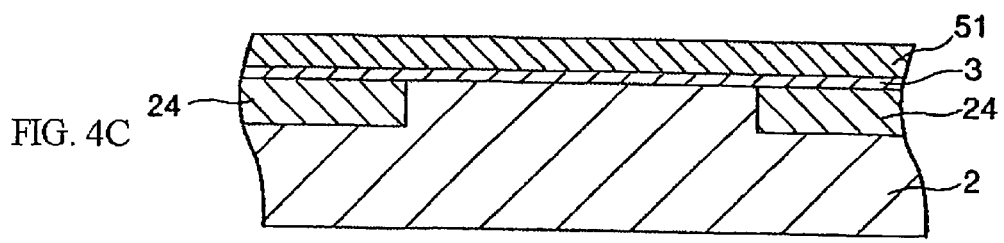

<4> Next, as shown in FIG. 4C, a conductive film 51 is formed on the gate insulating film 3. The conductive film 51 can be formed by depositing polycrystalline silicon or the like on the gate insulating film 3 with the CVD method, for example.

Figure 4D:
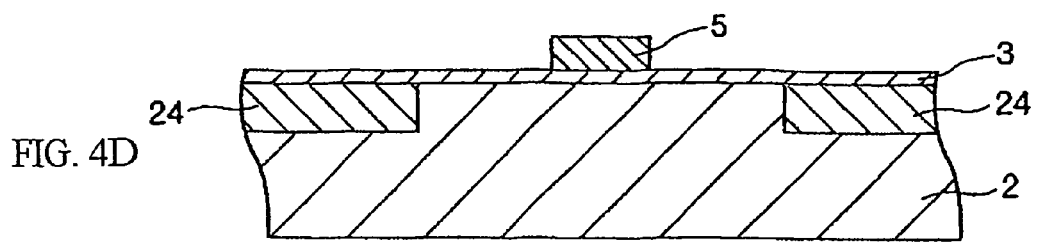

<5> Next, a resist mask corresponding to the shape of the gate insulating film 3 is formed on the conductive film 51 with a photolithography method or the like, for example. Then, unwanted portions of the conductive film 51 are eliminated via the resist mask with etching. Thus, it is possible to obtain the gate electrode 5 as shown in FIG. 4D. As this etching, physical etching method such as plasma etching, reactive etching, beam etching, photo assisted etching, chemical etching method such as wet etching, or the like may be mentioned. Further, One kind of these etching methods or combination of two or more kinds of these etching methods can be utilized as the etching.

Figure 4E:
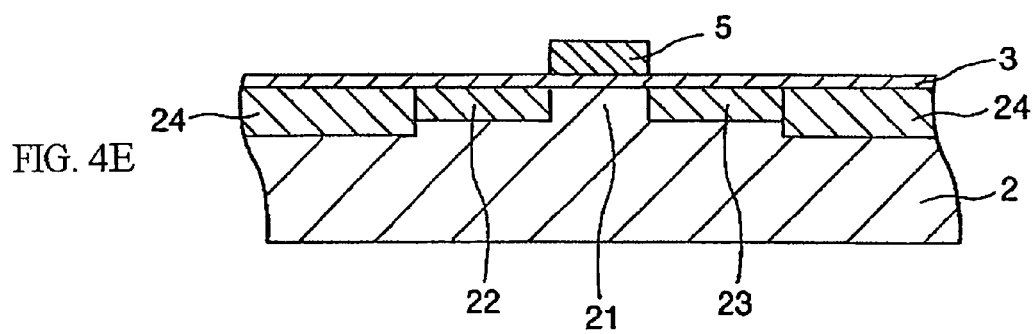

<6> Next, as shown in FIG. 4E, the source region 22 and the drain region 23 are formed by carrying out ion doping into both sides of the gate electrode 5 in the semiconductor substrate 2. At this time, in the case of forming the well with p-type impurities, the source region 22 and the drain region 23 are formed by doping n-type impurities such as $P^+$ into the both sides of the gate electrode 5. On the other hand, in the case of forming the well with n-type impurities, the source region 22 and the drain region 23 are formed by doping p-type impurities such as $B^+$ into the both sides of the gate electrode 5.

Figure 4F:
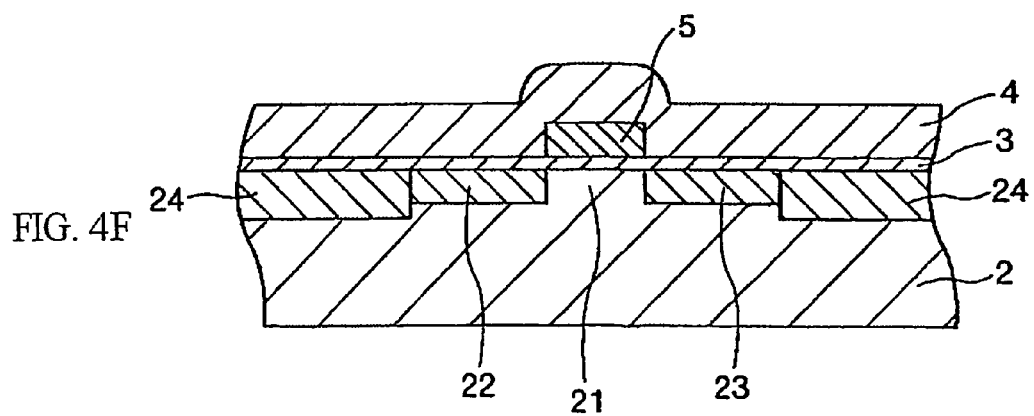

<7> Next, as shown in FIG. 4F, the interlayer insulating film 4 is formed by depositing $SiO_2$ or the like on the semiconductor substrate 2 on which the respective portions are formed with a CVD method or the like.

Figure 4G:
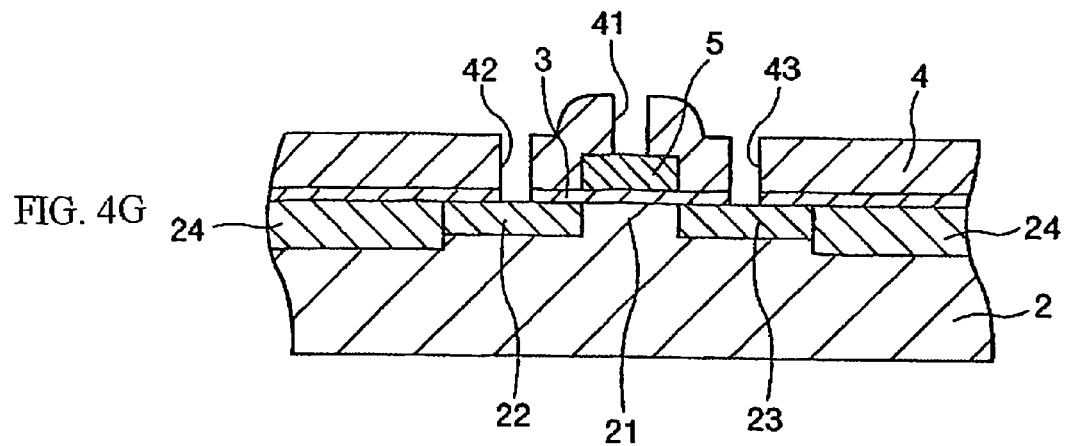

<8> Next, a resist mask in which portions corresponding to the contact holes opens is formed on the interlayer insulating film 4 with a photolithography method or the like, for example. Then, unwanted portions of the interlayer insulating film 4 are eliminated via the resist mask with etching. Thus, as shown in FIG. 4G, the contact holes 41, 42, and 43 are formed so as to correspond to the channel region 21, the source region 22, and the drain region 23, respectively.

<9> Next, a conductive film is formed by depositing a conductive material on the interlayer insulating film 4 including the insides of the contact holes 41, 42, and 43 with a CVD method or the like, for example.

Figure 4H:
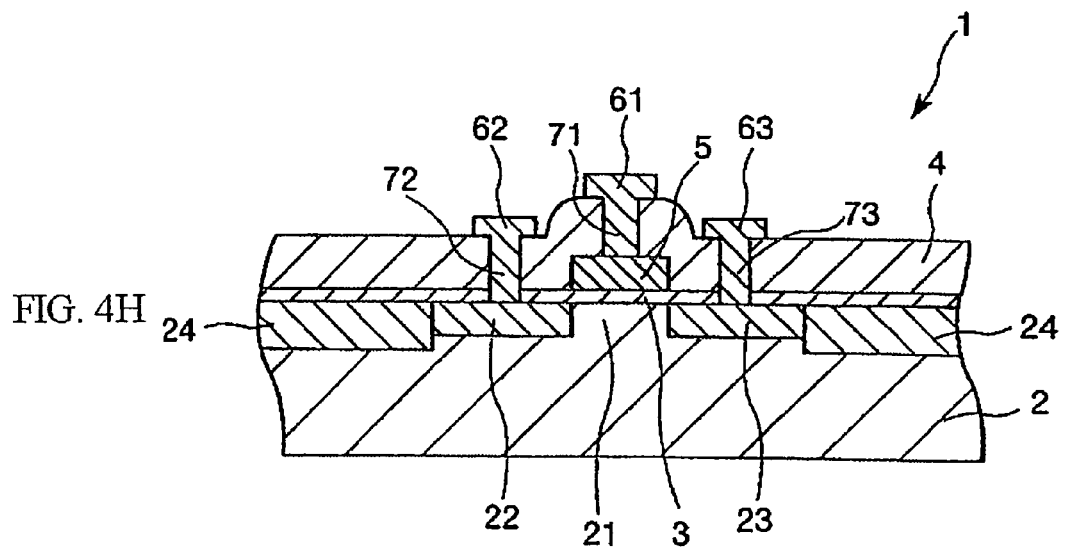

<10> Next, a resist mask corresponding to the shape of the conductive portion is formed on the conductive film with a photolithography method or the like, for example. Then, unwanted portions of the conductive film are eliminated via the resist mask with etching. Thus, as shown in FIG. 4H, the conductive portions 61, 62, and 63 and the contact plugs 71, 72, and 73 are formed so as to correspond to the channel region 21, the source region 22, and the drain region 23, respectively.

Through the steps described above, the semiconductor device 1 is manufactured.

<Electronic Device>

The semiconductor device 1 described above is applied to various types of electronic devices. Hereinafter, a case where an electronic device of the present invention including the semiconductor device 1 of the present invention is applied to a transmission liquid crystal display (LCD) will now be described as a representative example.

Figure 5:
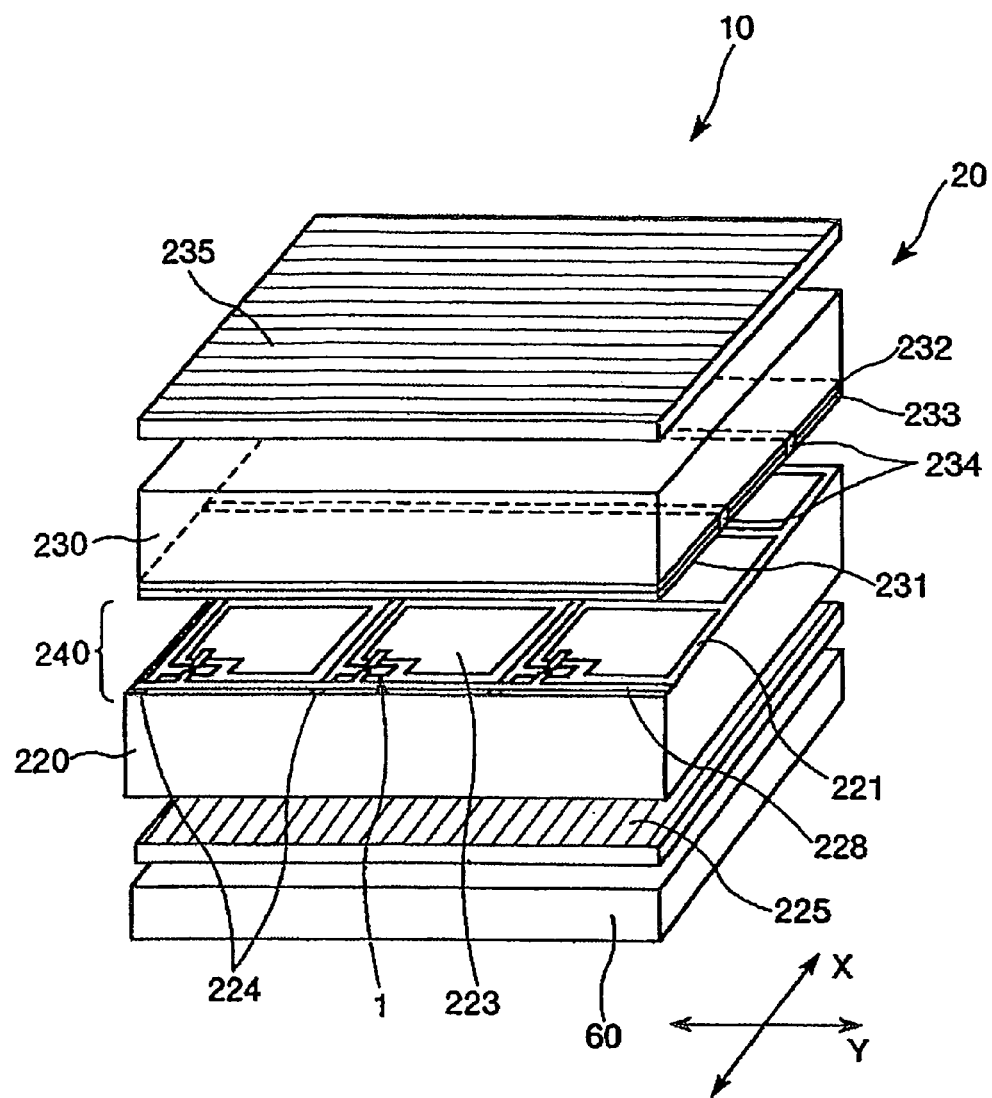
FIG. 5 is an exploded perspective view which shows an embodiment of an electronic device in the case of applying an electronic device of the present invention to a transmission liquid crystal display.

FIG. 5 is an exploded perspective view which shows an embodiment of an electronic device in the case of applying an electronic device of the present invention to a transmission liquid crystal display. In this regard, some members (components) of the transmission LCD in FIG. 5 are omitted in order to avoid complication of the drawings. Further, in following explanations using FIG. 5, for convenience of explanation, an upper side and lower side in FIG. 5 are referred to as "upper" and "lower," respectively.

This transmission liquid crystal display 10 shown in FIG. 5 (hereinafter, the transmission liquid crystal display 10 will be referred to simply as "liquid crystal display 10") includes a liquid crystal panel (display panel) 20, and a backlight (light source) 60. The liquid crystal display 10 can display an image (information) by transmitting light from the backlight 60 to the liquid crystal panel 20.

The liquid crystal panel 20 has a first plate 220 and a second plate 230 that are provided so as to face each other. Further, a seal member (not shown) is provided between the first and second plate 220, 230 so that a display area is surrounded by the seal member. A liquid crystal that is an electro-optical material is received in a space defined by the first plate 220, the second plate 230, and the seal member, thereby forming a liquid crystal layer (intermediary layer) 240. Namely, the liquid crystal layer 240 is inserted between the first plate 220 and the second plate 230.

Although illustrative representation is omitted, an orientational film constituted from polyimide, for example, is provided on each of upper and lower surfaces of the liquid crystal layer 240. Orientation (orientational direction) of liquid crystal molecules constituting the liquid crystal layer 240 is controlled by these orientational films. Each of the first plate 220 and the second plate 230 is formed of one of various kinds of glass materials, various kinds of resin materials, and the like, for example.

The first plate 220 is provided with a plurality of picture electrodes 223 arranged in a matrix manner on the top surface 221 thereof (that is, the surface facing the liquid crystal layer 240), scanning lines 224 each extending in an X direction of FIG. 5, and signal lines 228 each extending in a Y direction of FIG. 5. Each of the picture electrodes 223 is constituted from a transparent conductive film having transparency (optical transparency), and connected to one scanning line 224 and one signal line 228 via one semiconductor device (that is, a semiconductor device of the present invention) 1.

A polarizing plate 225 is provided on the lower surface of the first plate 220. On the other hand, the second plate 220 is provided with opposing electrodes 232 constituted from a plurality of strip on the lower surface 231 thereof (that is, the surface facing the liquid crystal layer 240). These opposing electrodes 232 are arranged in substantially parallel to each other so as to space by a predetermined distance each other and to face the picture electrode 223. A portion where the picture electrode 223 and the opposing electrode 232 are overlapped each other (which includes an adjacent portion) constitutes one pixel. By charging and discharging between the picture electrode 223 and the opposing electrode 232, in every pixel, the liquid crystal of the liquid crystal layer 240 is driven, that is, a orientational state of the liquid crystal is changed.

The opposing electrode 232 is also constituted from a transparent conductive film having transparency (optical transparency) as well as the picture electrode 223. Each of three colored layers including red (R), green (G) and blue (B) (color filter) 233 is provided on the lower surface of each of the opposing electrodes 232. These colored layers 233 are divided by a black matrix 234.

The black matrix 234 has a light blocking effect, and is formed of, for example, a metal such as chromium, aluminum, aluminum alloy, nickel, zinc, titanium, or a resin in which carbon or the like is dispersed. Further, a polarizing plate 235 of which the deflecting axis is different from that of the polarizing plate 225 is provided on the upper surface of the second plate 230.

In the liquid crystal panel 20 having such a structure, light emitting from the backlight 60 enters the liquid crystal layer 240 through the first plate 220 and the picture electrodes 223 after deflected with the polarizing plate 225. The intensity of the light entering the liquid crystal layer 240 is modulated with the liquid crystal in which orientational state of each of pixel is controlled. The intensity-modulated light passes through the colored layer 233, the opposing electrodes 232 and the second plate 230, and then deflected with the polarizing plate 235 to exit outside the liquid crystal display 10. Thus, in the liquid crystal display 10, it is possible to view a color image (including both a moving image and a still image) such as letter, numeric character, and figure (graphic form) from the opposite side to the liquid crystal layer 240 of the second plate 230.

In this regard, in the explanation described above, a case where the electronic device of the present invention is applied to an active matrix driving type of transmission liquid crystal device has been described as a representative example. However, the present invention is not limited thereto. In addition, it is possible to apply the electronic device of the present invention to a reflective liquid crystal display, organic or inorganic electroluminescence display, and an electrophoretic display.

<Electronic Device>

The liquid crystal display 10 described above (electronic device of the present invention) can be utilized as a display portion of each of various types of electronic apparatuses.

Figure 6:
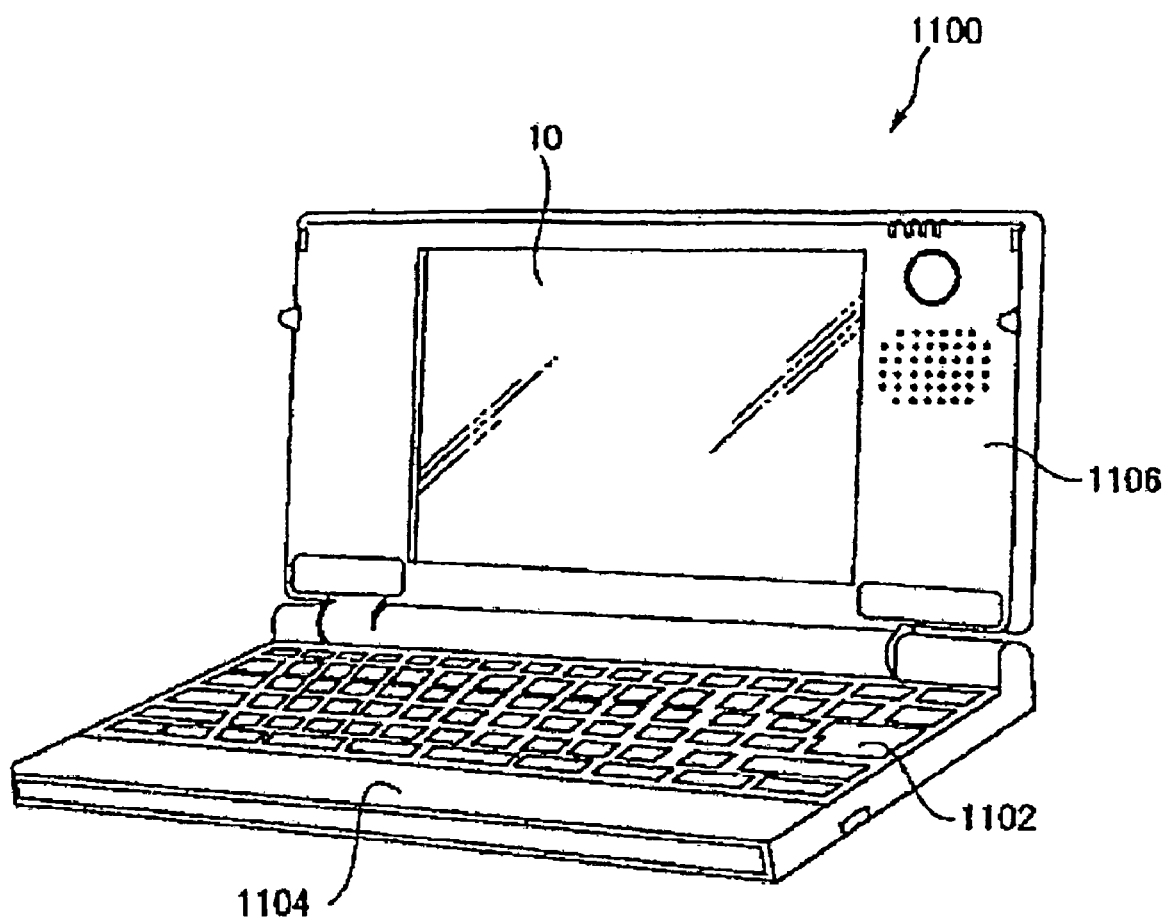
FIG. 6 is a perspective view which shows a structure of a mobile (or laptop type) personal computer to which an electronic apparatus of the present invention is applied.

FIG. 6 is a perspective view which shows a structure of a mobile (or laptop type) personal computer to which an electronic apparatus of the present invention is applied. Referring to FIG. 6, a personal computer 1100 is provided with a body 1104 having a keyboard 1102, and a display unit 1106. The display unit 1106 is rotatably supported on the body 1104 via a hinge portion. In this personal computer 1100, the display unit 1106 is provided with the liquid crystal display (electro-optical device) 10 described above.

Figure 7:
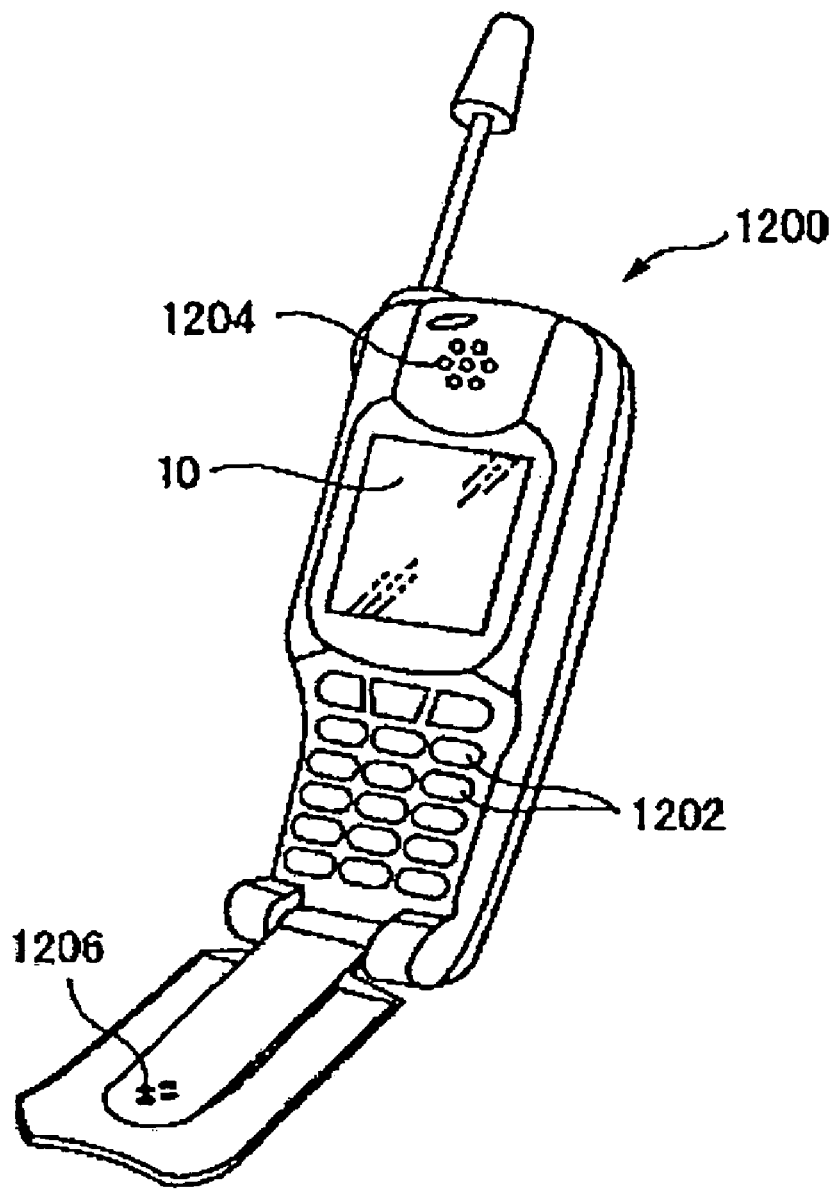
FIG. 7 is a perspective view which shows a structure of a portable phone (including a personal handyphone system) to which an electronic apparatus of the present invention is applied.

FIG. 7 is a perspective view which shows a structure of a portable phone (including a personal handyphone system) to which an electronic apparatus of the present invention is applied. Referring to FIG. 7, a portable phone 1200 is provided with a plurality of buttons 1202, an earpiece 1204, a mouthpiece 1206, and a display portion. The display portion is constituted from the liquid crystal display (electro-optical device) 10 described above.

Figure 8:
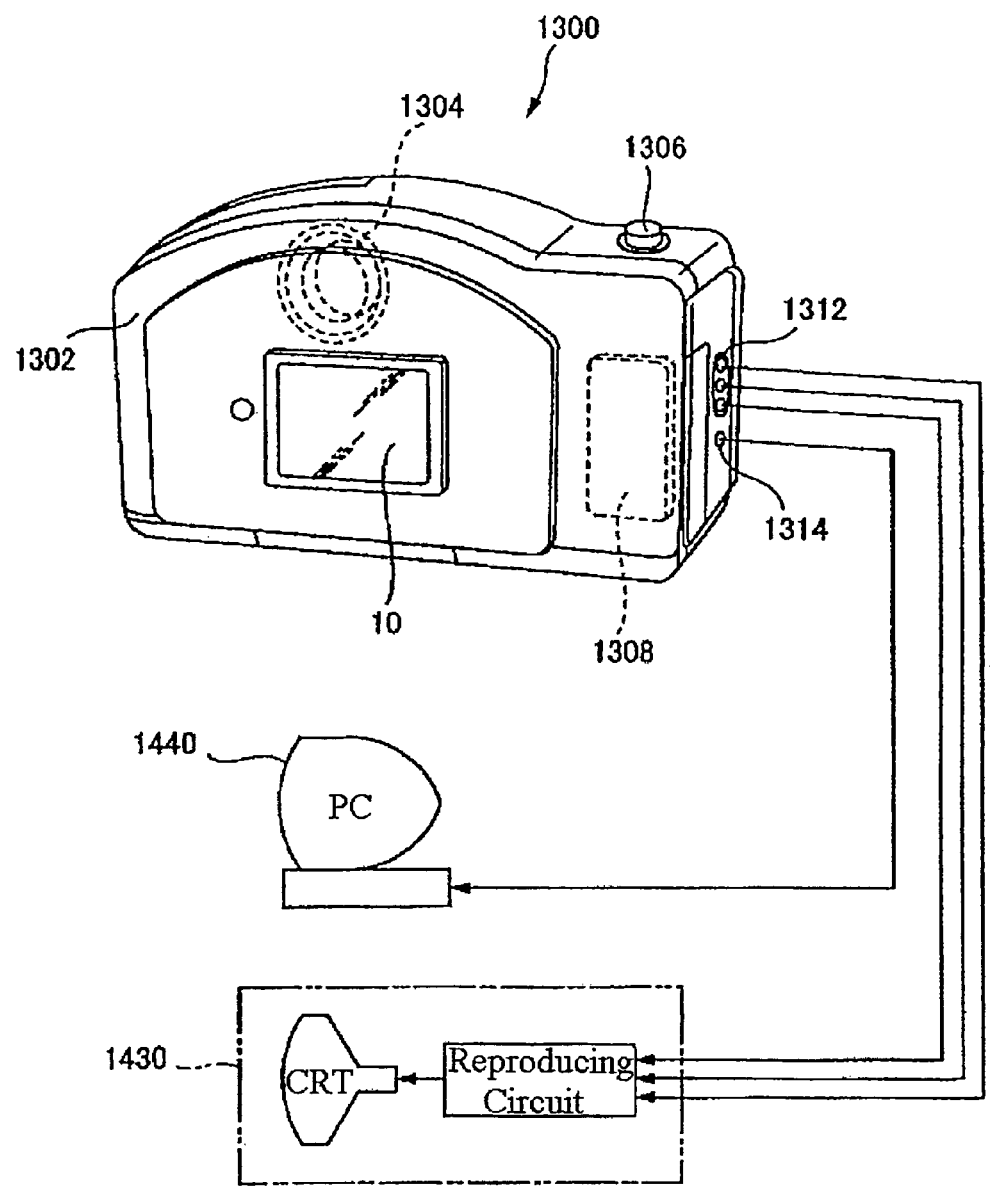
FIG. 8 is a perspective view which shows a structure of a digital still camera to which an electronic apparatus of the present invention is applied.

FIG. 8 is a perspective view which shows a structure of a digital still camera to which an electronic apparatus of the present invention is applied. In this drawing, connection of the digital still camera to external equipments thereof is schematically shown. A normal camera exposes a silver salt photographic film on the basis of an optical image of a subject, while the digital still camera 1300 generates an imaging signal (image signal) by photoelectrically converting an optical image of a subject into the imaging signal with imaging device such as a charge coupled device (CCD).

The liquid crystal display 10 described above is provided as a display portion on the back surface of a case (body) 1302 in the digital still camera 1300. The liquid crystal display 10 displays an image in response to an imaging signal by the CCD, and serves as a finder for displaying a subject as an electronic image. A circuit board 1308 is placed inside the case 1302. A memory capable of storing an imaging signal is placed on the circuit board 1308.

Further, a light receiving unit 1304 including an optical lens (imaging optical system), the CCD, and the like is provided in the front surface side of the case 1302. When a photographer confirms an image of a subject displayed on the display portion, and pushes a shutter button 1306, an imaging signal of the CCD at the time is transferred to the memory of the circuit board 1308 and stored in this memory.

Further, a video signal output terminal 1312 and a input/output terminal 1314 for data communication are provided on the side surface of the case 1302 in the digital still camera 1300. As shown in FIG. 8, a television monitor 1430 and a personal computer 1440 are respectively connected to the video signal output terminal 1312 and the input/output terminal 1314 for data communication if needed. Moreover, the imaging signal stored in the memory of the circuit board 1308 is outputted to the television monitor 1430 or the personal computer 1440 with a predetermined operation.

In this regard, the electronic apparatus of the present invention can be suitably used in (or applied to), for example, televisions, video cameras, view finder type or monitor direct view type videotape recorders, laptop type personal computers, car navigation devices, pagers, electronic notebooks (including those having communication functions), electronic dictionaries, pocket calculators, electronic game devices, word processors, work stations, television telephones, television monitors for crime prevention, electronic binoculars, POS (point-of-sale) terminals, apparatuses with touch panel (for example, cash dispensers in a financial institutions, automatic ticket vending machines), medical devices (electronic thermometers, blood pressure meters, blood sugar meters, electrocardiogram displaying devices, ultrasound diagnostic devices, displays for endoscopes, for example), fish finders, various measurement devices, gauges (gauges for vehicles, airplanes, ships and the like, for example), flight simulators, any other types of monitors, projection type displays such as projectors and the like, in addition to the personal computer (mobile personal computer) 1100 shown in FIG. 6, the portable phone 1200 shown in FIG. 7 and the digital still camera 1300 shown in FIG. 8.

The semiconductor device, the electronic device, and the electronic apparatus according to the present invention have been described based on the embodiment shown in the drawings, but it should be noted that the present invention is not limited to the embodiment. Respective portions of the semiconductor device, the electronic device, and the electronic apparatus can be replaced with an arbitrary arrangement capable of functioning in the same manner. Further, any other arbitrary component may be added to the semiconductor device, the electronic device, and the electronic apparatus of the present invention.

EXAMPLE

Next, a concrete example of the present invention will be described.
1. Manufacturing and Evaluation of Insulating Film
1-1. Manufacturing of Insulating Film
Nine insulating films were formed in Examples 1 to 6 and Comparative Examples 1 to 5 that will be described below.

Example 1

-1- A surface direction (100) p-type silicon crystal substrate (Si(100) substrate) was first prepared. The silicon crystal substrate was subject to a thermal oxidation process, and then a silicon oxynitride film (foundation layer) was formed with a CVD method. The thermal oxidation process was carried out in the atmosphere of water vapor ($H_2O$) having relative humidity of 33% RH at 750° C. Further, the CVD method was carried out for 40 minutes at 650° C. when the pressure in a chamber was 0.02 Pa and a gas of dichlorosilane ammonia was continually supplied into the chamber.

The thickness of the obtained silicon oxynitride film was 10 nm. In this regard, a leakage current in this silicon oxynitride film was extremely high ($1 \times 10^{-5}$ $A/cm^2$ or more) when a voltage (applied voltage) was applied to the silicon oxynitride film so that the electric field intensity in the silicon oxynitride film was in the range of 5 to 10 MV/cm.

-2- Next, a silicon oxide film was formed on this silicon oxynitride film with a CVD method. In this regard, the CVD method was carried out for 60 minutes at 650° C. when the pressure in the chamber was atmosphere pressure and a mixed gas of dichlorosilane ($SiHCl_2$) and oxygen ($O_2$) was continually supplied into the chamber. The average thickness of the obtained silicon oxide film was 3.7 nm.

-3- Next, this silicon oxide film was subject to heat treatment that was carried out in the atmosphere of water vapor ($H_2O$) having relative humidity of 95% RH at 900° C. for five minutes. By carrying out the steps as described above, an insulating film was obtained.

Example 2

By carrying out the steps as well as Example 1 described above except for the atmosphere of heavy water vapor ($D_2O$) in place of the atmosphere of water vapor ($H_2O$) in the step -3- described above, an insulating film having an average thickness of 3.8 nm was obtained.

Example 3

By carrying out the steps as well as Example 1 described above except to form a silicon oxynitride film with the CVD method in the step -2- described above, an insulating film having an average thickness of 4.2 nm was obtained.

Example 4

By carrying out the steps as well as Example 1 described above except to form a hafnium silicate film with the CVD method in the step -2- described above, an insulating film having an average thickness of 3.5 nm was obtained.

Example 5

By carrying out the steps as well as Example 1 described above except to form a zirconium silicate film with the CVD method in the step -2- described above, an insulating film having an average thickness of 4.1 nm was obtained.

Example 6

By carrying out the steps as well as Example 1 described above except to form an aluminum silicate film with the CVD method in the step -2- described above, an insulating film having an average thickness of 3.8 nm was obtained.

Comparative Example 1

By carrying out the steps as well as Example 1 described above except to omit the step -3- described above, an insulating film having an average thickness of 3.8 nm was obtained.

Comparative Example 2

By carrying out the steps as well as Example 3 described above except to omit the step -3- described above, an insulating film having an average thickness of 4.1 nm was obtained.

Comparative Example 3

By carrying out the steps as well as Example 4 described above except to omit the step -3- described above, an insulating film having an average thickness of 4.1 nm was obtained.

Comparative Example 4

By carrying out the steps as well as Example 5 described above except to omit the step -3- described above, an insulating film having an average thickness of 4.1 nm was obtained.

Comparative Example 5

By carrying out the steps as well as Example 6 described above except to omit the step -3- described above, an insulating film having an average thickness of 4.1 nm was obtained.

1-2. Evaluation for Insulating Film
1-2-1. Measurement of Infrared Absorbing Spectrum The absorption of infrared radiation was measured with a multi-reflection attenuated total reflection (ATR) method (infrared spectroscopy) with respect to each of Examples 1 to 6 and Comparative Examples 1 to 5. In this case, the measurement conditions of the multi-reflection ATR method were as follows.

| | |
|---|---|
| FTIR apparatus: | IFS-120HR (made by Bruker) |
| light source: | SiC |
| detector: | MCT |
| beam splitter: | Ge/KBr |
| resolution | 4 cm$^{-1}$ |
| attachments: | attachment for multi-reflection ATR measurement (made by Wilkes) |
| prism: | Ge |
| incident angle: | 60° |
| polarization | P polarization |

Figure 9:
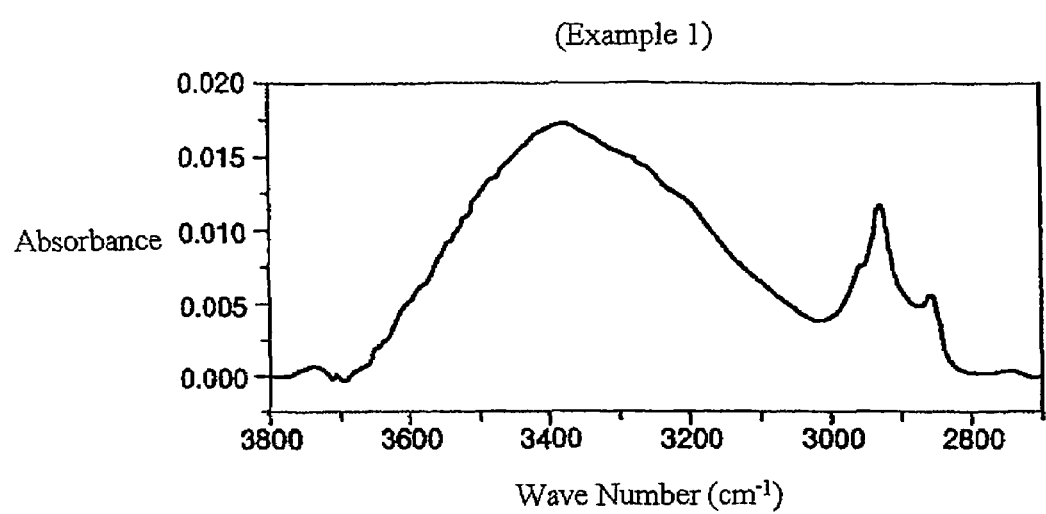
FIG. 9 is a drawing which shows an infrared absorption spectrum obtained from an insulating film of Example 1.
Figure 10:
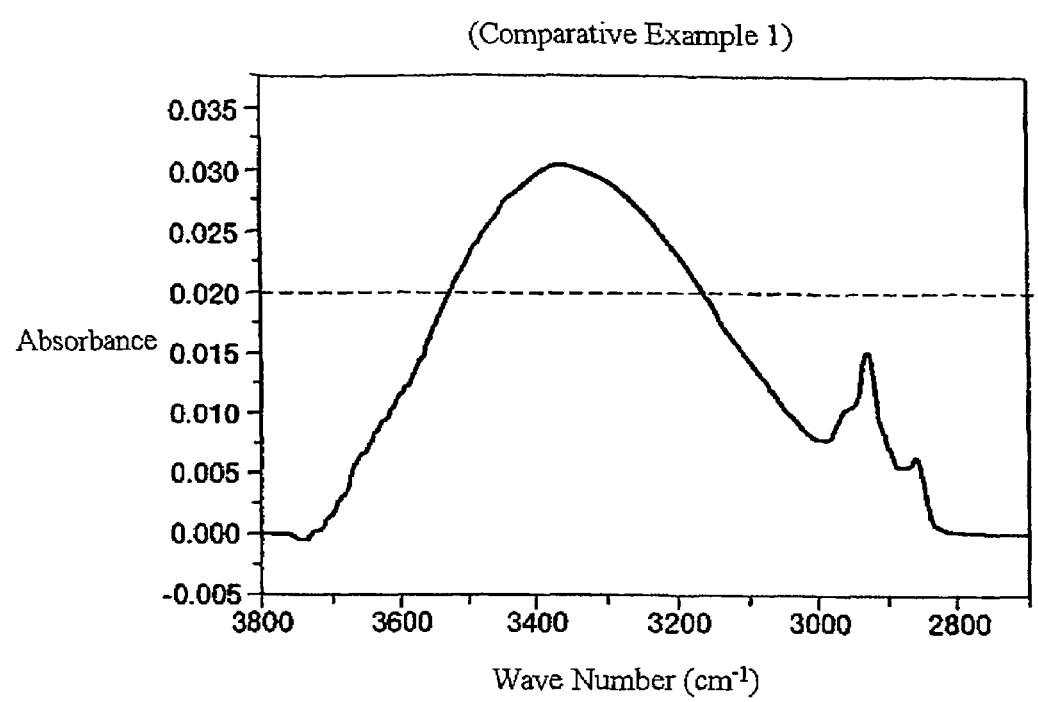
FIG. 10 is a drawing which shows an infrared absorption spectrum obtained from an insulating film of Comparative Example 1.

The maximum values (peak values) of absorbance measured with the infrared radiation of which wave number is in the range of 3200 to 3500 cm$^{-1}$ in the insulating films obtained in each of Examples 1 to 6 and Comparative Examples 1 to 5 are shown in TABLE 1 described below. In this regard, the numerical values in TABLE 1 is an average value of the nine insulating film. As an example, the infrared absorption spectra (the relationship between the absorbance and the wave number of the infrared radiation) obtained from the insulating films of Example 1 and Comparative Example 1 are shown in FIGS. 9 and 10, respectively. FIG. 9 is a drawing which shows an infrared absorption spectrum obtained from an insulating film of Example 1. FIG. 10 is a drawing which shows an infrared absorption spectrum obtained from an insulating film of Comparative Example 1.

TABLE 1

| | Insulating Film | Maximum Absorbance |
|---|---|---|
| Ex. 1 | silicon oxide film | 0.0174 |
| Ex. 2 | silicon oxide film (deuterated) | 0.0145 |
| Ex. 3 | silicon oxynitride film | 0.0125 |
| Ex. 4 | hafnium silicate film | 0.0178 |
| Ex. 5 | zirconium silicate film | 0.0195 |
| Ex. 6 | aluminum silicate film | 0.0182 |
| Co-Ex. 1 | silicon oxide film | 0.0298 |
| Co-Ex. 2 | silicon oxynitride film | 0.0232 |
| Co-Ex. 3 | hafnium silicate film | 0.0303 |
| Co-Ex. 4 | zirconium silicate film | 0.0315 |
| Co-Ex. 5 | aluminum silicate film | 0.0311 |

As shown in TABLE 1, FIG. 9 and FIG. 10, the peak value of the absorption of the infrared radiation of the insulating film in each of Examples 1 to 6 is 0.02 or less. On the other hand, the peak value of the absorption of the infrared radiation of the insulating film in each of Comparative Examples 1 to 5 greatly exceeds 0.02.

1-2-2. Measurement of Leakage Current

Next, changes in the leakage current values was measured with respect to each of Examples 1 to 6 and Comparative Examples 1 to 5 when the electric field intensity (that is, the applied voltage value) to each insulating film was changed. In this case, the measured area was determined to be 0.02039 cm$^2$.

Figure 11:
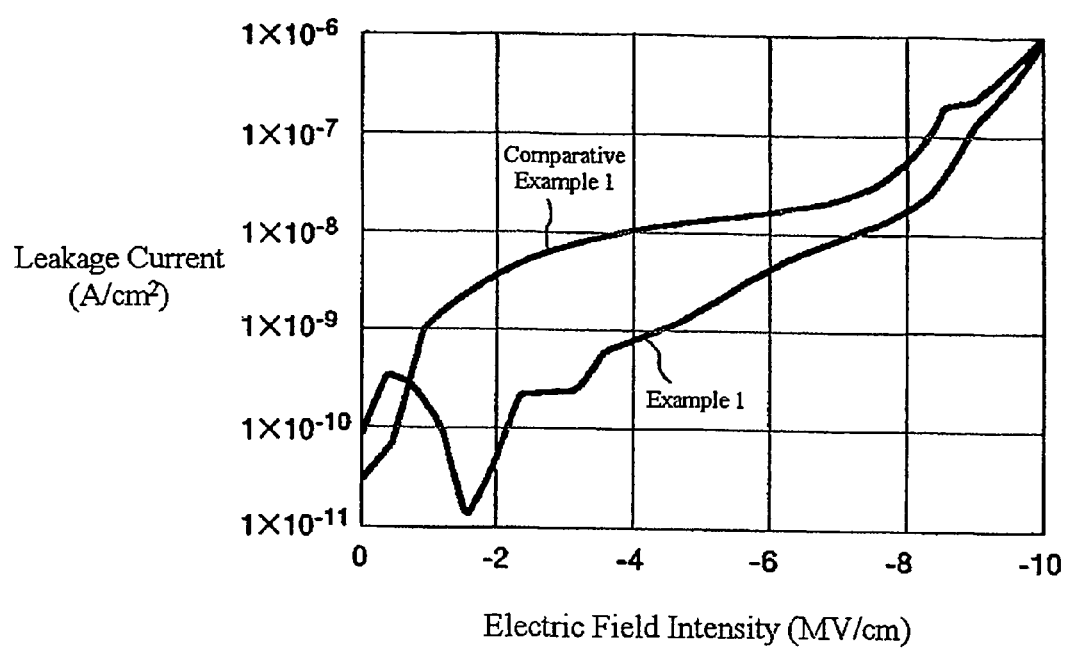
FIG. 11 is a graph which shows a relationship between a change in electric field intensity and a change in a leakage current both measured in the insulating films of Example 1 and Comparative Example 1.

The maximum values of the leakage current measured when the electric field intensity was in the range of 0 to −5 MV/cm in the insulating films obtained in each of Examples 1 to 6 and Comparative Examples 1 to 5 are shown in TABLE 2 described below. In this regard, the numerical values in TABLE 2 is an average value of the nine insulating film. As an example, the changes in the electric field intensity and the change in the leakage current value measured in the insulating films of Example 1 and Comparative Example 1 are shown in FIG. 11. FIG. 11 is a graph which shows a relationship between a change in electric field intensity and a change in a leakage current both measured in the insulating films of Example 1 and Comparative Example 1.

TABLE 2

| | Insulating Film | Maximum Value of Leakage Current (A/cm$^2$) |
|---|---|---|
| Ex. 1 | silicon oxide film | $3 \times 10^{-9}$ |
| Ex. 2 | silicon oxide film (deuterated) | $2 \times 10^{-9}$ |
| Ex. 3 | silicon oxynitride film | $1 \times 10^{-9}$ |
| Ex. 4 | hafnium silicate film | $3 \times 10^{-9}$ |
| Ex. 5 | zirconium silicate film | $4 \times 10^{-9}$ |
| Ex. 6 | aluminum silicate film | $3 \times 10^{-9}$ |
| Co-Ex. 1 | silicon oxide film | $2 \times 10^{-8}$ |
| Co-Ex. 2 | silicon oxynitride film | $1 \times 10^{-8}$ |
| Co-Ex. 3 | hafnium silicate film | $2 \times 10^{-8}$ |
| Co-Ex. 4 | zirconium silicate film | $3 \times 10^{-8}$ |
| Co-Ex. 5 | aluminum silicate film | $3 \times 10^{-8}$ |

As shown in TABLE 2 and FIG. 11, the leakage current value in the insulating film of each of Examples 1 to 6 when the electric field intensity was in the range of 0 to −10 MV/cm (in particular, in the range of 0 to −5 MV/cm) was restricted to low value. On the other hand, in the insulating film of each of Comparative Examples 1 to 5, a large leakage current flowed even at lower electric field intensity.

1-2-3. Measurement of Qbd Value

Next, the Qbd value was measured with respect to the insulating film of each of Examples 1 to 6 and Comparative Examples 1 to 5. Here, the "Qbd value" means total electrical charges (that is, total amount of current) which flows in the insulating film in the thickness direction thereof when a dielectric breakdown occurs. The larger the Qbd value is, the more difficultly a dielectric breakdown occurs. In this measurement of the Qbd value, when a constant current is supplied to an insulating film using mercury electrodes, a time point when a small change in voltage occurs first time is determined to be the SBD, and a time point when a drastic change in voltage occurs is determined to be the HBD. Total electrical charges (Qbd value (SBD)) that pass through the insulating film until a SBD occurs and total electrical charges (Qbd value (HBD)) that pass through the insulating film until a HBD occurs were measured. In this case, the measured area was determined to be 0.02039 cm$^2$, and a constant current value applied to the insulating film was determined to be 0.01226 A/cm$^2$.

The Qbd value (SBD) and the Qbd value (HBD) thus measured in the insulating film of each of Examples 1 to 6 and Comparative Examples 1 to 5 are shown in TABLE 3 described below. In this regard, the numerical values in TABLE 3 is an average value of the nine insulating film.

TABLE 3

| | Insulating Film | Qbd value (C/cm$^2$) | |
|---|---|---|---|
| | | SBD | HBD |
| Ex. 1 | silicon oxide film | 85 | 270 |
| Ex. 2 | silicon oxide film (deuterated) | 88 | 331 |
| Ex. 3 | silicon oxynitride film | 92 | 369 |
| Ex. 4 | hafnium silicate film | 80 | 257 |
| Ex. 5 | zirconium silicate film | 75 | 234 |
| Ex. 6 | aluminum silicate film | 79 | 245 |
| Co-Ex. 1 | Silicon oxide film | 10 | 40 |
| Co-Ex. 2 | silicon oxynitride film | 23 | 95 |
| Co-Ex. 3 | hafnium silicate film | 11 | 38 |
| Co-Ex. 4 | zirconium silicate film | 8 | 27 |
| Co-Ex. 5 | aluminum silicate film | 7 | 25 |

As shown in TABLE 3, the Qbd value (SBD) of the insulating film in each of Examples 1 to 6 was larger than the Qbd value (SBD) of the insulating film in each of Comparative Examples 1 to 5. Further, the Qbd value (HBD) of the insulating film in each of Examples 1 to 6 was larger than the Qbd value (HBD) of the insulating film in each of Comparative Examples 1 to 5 as well as the Qbd value (SBD).

From each of evaluation results described above, it is apparent that the insulating film in which the absorbance of infrared radiation of which wave number is in the range of 3200 to 3500 cm$^{-1}$ is 0.02 or less (that is, the insulating film of the present invention) has superior resistance to a dielectric breakdown. Further, the tendency that the resistance to a dielectric breakdown of the insulating film is improved as the absorption becomes lower is shown.

2. Manufacturing and Evaluation of Semiconductor Device 2-1. Manufacturing of Semiconductor Device The semiconductor device shown in FIG. 1 was manufactured in accordance with the method described in the above embodiment. In this case, the gate insulating film was formed as well as each of Examples 1 to 6 and Comparative Examples 1 to 5 described above.

2-2. Evaluation for Semiconductor Device

The switching characteristics of each semiconductor, device were examined. As a result, good switching characteristics were obtained for a long time in the semiconductor device including each of the gate insulating films formed in the same manner as Examples 1 to 6. On the other hand, in the semiconductor device including each of the gate insulating films formed in the same manner as Comparative Examples 1 to 5, a leakage current was recognized and the switching characteristics were unstable. Thus, a dielectric breakdown occurred in the gate insulating film early, and a function as a switching device was lost.

The invention claimed is:

1. A semiconductor device comprising:
   a gate electrode; and
   a gate insulating film for insulating the gate electrode, the gate, insulating film being formed of an insulative inorganic material as a main material, the insulative inorganic material containing silicon and oxygen, the insulating film containing hydrogen atoms, and the gate insulating film including Si—O(H)—Si structures therein;
   wherein the average thickness of the gate insulating film is 10 nm or less, and the absorbance of infrared radiation of which wave number is in the range of 3200 to 3500 cm$^{-1}$, which is derived from an OH structure of any of the Si—O(H)—Si structures existing in the gate insulating film, is 0.02 or less when the gate insulating film to which an electric field has never been applied is measured with Multi-Reflection Attenuated Total Reflection Method at room temperature.

2. The semiconductor device as claimed in claim 1, wherein the insulative inorganic material further includes at least one of nitrogen, hafnium, zirconium, and aluminum in addition to oxygen.

3. The semiconductor device as claimed in claim 1, wherein each hydrogen atom in at least a part of the hydrogen atoms is replaced by a deuterium atom.

4. The semiconductor device as claimed in claim 1, wherein the semiconductor device is adapted to be used under the condition that a gate voltage is applied to the gate electrode so that the electric field intensity in the insulating film is 10 MV/cm or less.

5. The semiconductor device as claimed in claim 1, wherein a leakage current passing through the gate insulating film in the thickness direction thereof that is measured in a state that a gate voltage is applied to the gate electrode so that the electric field intensity in the insulating film is 5 MV/cm or less is $9 \times 10^{-9}$ A/cm$^2$ or less.

6. The semiconductor device as claimed in claim 1, wherein the total amount of electrical charges passing through the gate insulating film in the thickness direction thereof until a soft breakdown occurs in the insulating film is 40 C/cm$^2$ or more.

7. The semiconductor device as claimed in claim 1, wherein the total amount of electrical charges passing through the gate insulating film in the thickness direction thereof until a hard breakdown occurs in the insulating film is 100 C/cm$^2$ or more.

8. An electronic device comprising the semiconductor device defined by claim 1.

9. An electronic apparatus comprising the electronic device defined by claim 8.

* * * * *